United States Patent [19]

Zojer et al.

[11] Patent Number: 4,633,219

[45] Date of Patent: Dec. 30, 1986

[54] INTEGRABLE ANALOG-TO-DIGITAL CONVERTER

[75] Inventors: Bernhard Zojer; Reinhard Petschacher, both of Villach, Austria

[73] Assignee: Siemens Aktiengesellschaft, Berlin and Munich, Fed. Rep. of Germany

[21] Appl. No.: 701,561

[22] Filed: Feb. 14, 1985

[30] Foreign Application Priority Data

Feb. 15, 1984 [DE] Fed. Rep. of Germany ....... 3405438

[51] Int. Cl.$^4$ .............................................. H03M 1/00
[52] U.S. Cl. ........................ 340/347 AD; 340/347 M
[58] Field of Search ..................... 340/347 AD, 347 M

[56] References Cited

U.S. PATENT DOCUMENTS

| | | | |
|---|---|---|---|
| 4,099,173 | 7/1978 | Zeskino et al. | 340/347 AD |
| 4,211,999 | 7/1980 | Clark et al. | 340/347 AD |
| 4,217,574 | 8/1980 | Anderson | 340/347 AD |
| 4,250,492 | 2/1981 | Yamakino et al. | 340/347 AD |
| 4,449,118 | 5/1984 | Dingwall et al. | 340/347 AD |
| 4,496,935 | 1/1985 | Inoue et al. | 340/347 AD |

OTHER PUBLICATIONS

IEEE Journal of Solid–State Circuits, vol. SC–17, No. 6, 12/1982, pp. 1113 to 1138.
Electronic Engineering, 8/1980, pp. 37 to 44.
Analog–to–Digital Conversion Techniques, 1968, pp. 10 to 12 and 409 to 412.

*Primary Examiner*—Bernard Roskoski
*Attorney, Agent, or Firm*—Herbert L. Lerner; Laurence A. Greenberg

[57] ABSTRACT

An analog-to-digital converter includes a voltage divider (ST) having n series-connected resistors ($R_v$; $v = 1, 2, \ldots n$), divider points between the resistors ($R_v$) and an end receiving a d-c reference voltage ($U_R$) versus a base point potential, n identical comparators ($K_v$) each having a first input receiving an analog signal to be processed, a second reference input each being connected to a respective one of the divider points, and an output, a common control logic circuit (LS) connected to the outputs of the comparators ($K_v$) for furnishing a digital signal corresponding to the analog signal to be processed, each of the resistors ($R_v$) being connected between one of the divider points which divider point is applied to that one of the comparators ($K_v$), which is associated with a given ($v^{th}$) output code, and another of the divider points assigned to the next lower output code, and each of the resistors ($R_v$) having a resistance value satisfying the condition:

$$R_v^2 + \left[ \sum_{k=1}^{n-v} \{(k+1) \cdot R_{v+k}\} - \sum_{k=1}^{v} R_k - (U_R/I_B) \right] \cdot R_v +$$

$$\left[ ((U_R - U_{v-1})/I_B) - \sum_{k=1}^{n-v} (k+1)R_{v+k} \right] \cdot \sum_{k=1}^{v} R_k -$$

$$(U_{v-1}/I_B) \cdot \sum_{k=1}^{n-v} R_{v+k} = 0,$$

where $I_B$ is the maximum current flowing through the second reference inputs of said comparators, and $U_v$ is the desired value of the reference voltage at the comparators.

1 Claim, 1 Drawing Figure

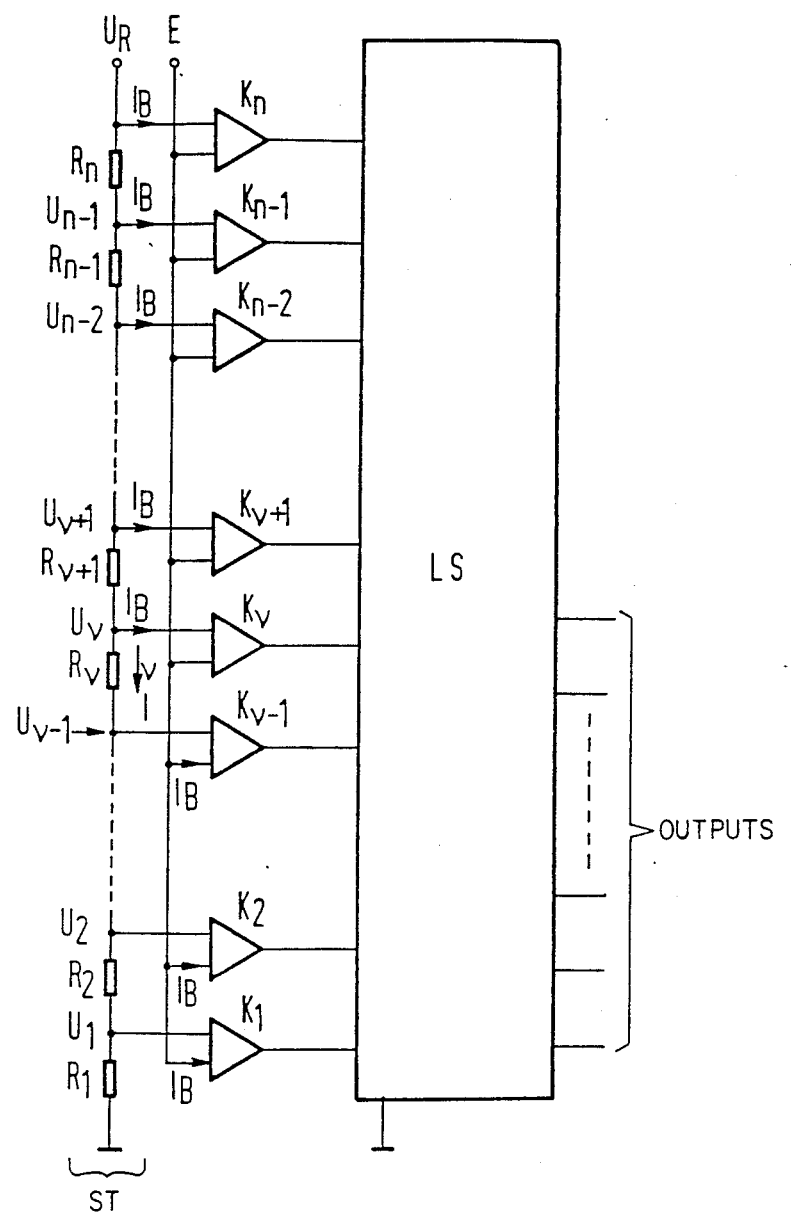

INTEGRABLE ANALOG-TO-DIGITAL CONVERTER

BACKGROUND OF THE INVENTION

1. Field of the Invention

The invention relates to an integrable analog-to-digital converter, in which the analog signal to be processed is simultaneously connected to one input of each of n identical comparators, while the other input of each of the comparators is connected to a respective divider point of a voltage divider formed of n series-connected resistors, the ends of the voltage divider are acted upon by a reference d-c voltage, and the outputs of the comparators control a common logic circuit which furnishes a digital signal corresponding to the analog signal.

2. Description of the Related Art

In such circuits, the value of the reference voltage varies at the inputs of the comparators, causing nonlinearities. The use of emitter followers has been proposed for overcoming these non-linearities. However, these measures are not always sufficient and more elaborate circuitry is then required. The prior art devices are more fully discussed below.

Such analog-to-digital converters operating according to the parallel method are described, for instance, in the book by Tietze and Schenk entitled: "Halbleiter-schaltungstechnik" (Semiconductor Switching Technique) (1980), pages 653 to 657, in U.S. Pat. No. 4,099,173 and in the publication "IEEE Journal of Solid-State Circuits", vol. SC 17, No. 6 (December 1982), pages 1133 to 1138.

It is accordingly an object of the invention to provide an integrable analog-to-digital converter which overcomes the hereinafore-mentioned disadvantages of the heretofore-known devices of this general type.

SUMMARY OF THE INVENTION

With the foregoing and other objects in view there is provided, in accordance with the invention, an analog-to-digital converter, comprising a voltage divider (ST) having n series-connected resistors ($R_\nu$; $\nu=1,2,\ldots n$), divider points between the resistors ($R_\nu$) and an end receiving a d-c reference voltage ($U_R$) versus a base point potential, n identical comparators ($K_\nu$) each having a first input receiving an analog signal to be processed, a second reference input each being connected to a respective one of the divider points, and an output, a common control logic circuit (LS) connected to and controlled by the outputs of the comparators ($K_\nu$) for furnishing a digital signal corresponding to the analog signal to be processed, and each of said resistors ($R_\nu$) having a resistance value satisfying the condition:

$$R_\nu^2 + \left[\sum_{k=1}^{n-\nu}\{(k+1)\cdot R_{\nu+k}\} - \sum_{k=1}^{\nu} R_k - (U_R/I_B)\right]\cdot R_\nu +$$

$$\left[((U_R - U_{\nu-1})/I_B) - \sum_{k=1}^{n-\nu}(k+1)R_{\nu+k}\right]\cdot \sum_{k=1}^{\nu} R_k -$$

$$(U_{\nu-1}/I_B)\cdot \sum_{k=1}^{n-\nu} R_{\nu+k} = 0,$$

where $I_B$ is the maximum current flowing through the second reference inputs of the comparators, and $U_\nu$ is the desired value of the reference voltage at the comparators.

Other features which are considered as characteristic for the invention are set forth in the appended claims.

Although the invention is illustrated and described herein as embodied in an integrable analog-to-digital converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawings.

BRIEF DESCRIPTION OF THE DRAWING

The FIGURE of the drawing is a schematic and block circuit diagram for an analog-to-digital converter.

DESCRIPTION OF THE PREFERRED EMBODIMENT

Referring now to the FIGURE of the drawing in detail, it is seen that n identical comparators $K_1, K_2, \ldots K_n$ are provided with two inputs each in the usual manner. The first input is acted upon by an analog signal E to be processed, and the other input is acted upon by a potential from the $\nu^{th}$ divider point corresponding to a respective comparator $K_\nu$ of a voltage divider ST formed by n resistors $R_1, R_2, \ldots R_n$. The divider point next to the base point potential between the resistors $R_1$ and $R_2$ of the voltage divider ST is connected to the reference input of the comparator $K_1$ associated with the lowest output code LSB of the converter (i.e., the digital value $2^0$).

In general, the comparator $K_\nu$ which is connected to the $\nu^{th}$ divider point of the voltage divider ST, as counted in the direction of increasing distance from the base point potential, is associated with the $\nu^{th}$ output code of the converter. An external reference potential $U_R$ is applied to the other end of the voltage divider ST which is formed of the n series-connected resistors $R_1, R_2 \ldots R_n$.

The outputs of the comparators $K_1, K_2 \ldots K_n$ each control one or two inputs of a logic circuit LS which is constructed in the usual manner and in particular functions as an encoder. The details of the structure of the logic circuit is of no interest for the present invention.

If a voltage divider formed of n ideally identical reference resistors $R_\nu$ ($R_\nu=R_O$) is used for generating reference voltages required for generating the $n=2^k$ for a k-bit parallel A/D converter, deviations from the desired values of the reference voltages occur at the reference inputs acted upon by the voltage divider of the individual comparators $K_\nu$ due to input currents $I_B$ flowing through these resistors of the comparators, which in turn cause nonlinearities. For the $\nu^{th}$ comparator $K_\nu$, the magnitude of these deviations depends on the level of the analog voltage E and is between the value zero and a maximum value of $$U_\nu=(n-\nu)(n-\nu+1)R_O I_B/2n.$$

In order to ensure that the linearity error cannot become larger than one-half LSB (least significant bit), the value $R_O$ for the individual resistors R or the voltage divider must fulfill the condition $$R_O < 27\, U_R/4I_Bn^3.$$

The shunt current $I_s$ flowing through the voltage divider ST then fulfills the condition $$I_s > 4I_Bn^2/27.$$

The current $I_B$ can be decreased by emitter followers disposed at the comparator input. However, this measure is no longer sufficient when dealing with an increasing number of bits in the A/D converters in order to set reasonable limits for the resistors $R_O$ forming the divider and the shunt current $I_s$.

It is accordingly necessary to fall back to very elaborate concepts such as are provided, for instance, by keeping partial voltages constant through the use of laser-trimmed resistors in the voltage divider ST and operational amplifiers. These measures are described in the publication "1976 IEEE International Solid-State Circuit Conference, pages 150 and 151" as well as in the publication "IEEE Journal of Solid-State Circuits, vol. SC-17, No. 6 (December 1982), pages 1133 to 1138".

Since it is desirable to provide a less elaborate solution of the problem of avoiding the above-mentioned nonlinearities, the present invention seeks to overcome this problem and proposes the solution which is defined and described below.

According to the present invention, in the analog/digital converter described above, the $v^{th}$ divider point of the voltage divider ST applied to the comparator $K_v$ ($v = 1, 2, \ldots n$), which is associated with the $v^{th}$ output code, is separated from the divider point of the voltage divider, which is associated with the next lower output code, by a resistor, the value $R_v$ of which satisfies the condition $$R_v^2 + \left[\sum_{k=1}^{n-v}\{(k+1)\cdot R_{v+k}\} - \sum_{k=1}^{v} R_k - (U_R/I_B)\right]\cdot R_v +$$

$$\left[((U_R - U_{v-1})/I_B) - \sum_{k=1}^{n-v}(k+1)\cdot R_{v+k}\right]\cdot \sum_{k=1}^{v} R_k -$$

$$(U_{v-1}/I_B)\cdot \sum_{k=1}^{n-v} R_{v+k}) = 0$$

where $U_R$ is the reference voltage present at the voltage divider ST, and $I_B$ is the current flowing through the reference input of the individual comparator $K_v$.

For a better understanding of the invention, the technical reason for the structure just described above, will be explained using the resistors $R_v$ of the voltage divider ST. An example applying this structure in determining the resistance value for the individual resistor will then be given.

The essential aspect of the invention in this case is the fact that it is sufficient for providing an ideal linear analog/digital converter if for any voltage $U_{An}$ at the analog input of the converter (formed by the signal input terminal E and the terminal for the base point potential), the reference voltage assumes the desired value U at the sampling time $t_O$ to which the condition $$U_v > U_{An}(t_o) \geq U_{v-1}$$

applies. However, the values of the other reference voltages can deviate from their desired values at this time $t_O$, because they then have no influence on the signal output of the converter. The mathematical formulation of this situation furnishes a system of $(n-1)$ nonlinear equations in the n resistors $R_v$ of the voltage divider ST with the desired values for $U_v$ that have been given.

One of these resistors can then be chosen freely as the starting value.

This equation system can be readily resolved recursively and explicitly furnishes the necessary corrections of resistance values. If the resistance values of the voltage divider ST are then adjusted in this sense, a deviation from linearity can only be caused by fluctuations of the comparator input current $I_B$ which is assumed as a constant in the above-mentioned equation system.

It may be assumed that when the voltage divider ST acts on the n comparators $K_1, K_2, \ldots K_n$, shown in the drawing, the input currents $I_B$ on the reference side of the comparator $K_1$ up to the point immediately ahead of the comparator $K_v$ under consideration are equal to zero, if the signal voltage $U_A$ at the analog input E of the converter is larger than the signal voltage present at the reference input of the $(v-1)^{th}$ comparator, i.e., at the comparator $K_{v-1}$, and smaller than the desired value $U_v$ of the reference voltage at the comparator $K_v$. In this case the following can be said for the divider point of the voltage divider ST assigned to the comparator $K_v$:

$$U_v = \sum_{k=1}^{v} R_k \cdot I_v \tag{I}$$

and $$U_R - U_v = \sum_{k=1}^{n-v}(I_v + k\cdot I_B)R_{v+k}. \tag{II}$$

These two equations directly lead to the following:

$$(U_R - U_v)\sum_{k=1}^{v} R_k = U_v\sum_{k=1}^{n-v} R_{v+k} + I_B\sum_{i=1}^{v} R_i\cdot\sum_{k=1}^{n-v} k\cdot R_{v+k}, \tag{III}$$

with $1 \leq v \leq (n-1)$.

If the desired value provided for the reference voltages $U_v$ to be supplied by the voltage divider ST is given, the equation system (III) can be resolved without a problem. For instance, in view of the desirable constant differences $U_v - U_v$ of the reference voltages, the relation $$U_v = U_R\cdot v/n$$

can be used. However, voltage drops at the analog signal line can also be taken into consideration.

The system of $(n-1)$ equations for the n resistors $R_v$ can be resolved easily as follows. This is because when the identity:

$$\sum_{k=1}^{v} R_k = \sum_{k=1}^{v+1} R_k - R_{v+1}$$

is substituted in (III), the relation $$R_v^2 + \left\{ \sum_{k=1}^{n-v} (k+1) \cdot R_{v+k} - \sum_{k=1}^{v} R_k - (U_R/I_B) \right\} \cdot R_v +$$

$$\left\{ ((U_R - U_{v-1})/I_B) - \sum_{k=1}^{n-v} (k+1) \cdot R_{v+k} \right\} \cdot \sum_{k=1}^{v} R_k -$$

$$(U_{v-1}/I_B) \cdot \sum_{k=1}^{n-v} R_{v+k} = 0$$

is obtained after several transformations of the equation system.

If the mean value $R_O$ of the resistors R is given, the system given by this relationship can readily be resolved recursively, as will now be shown:

(a) For v=n:

$$\sum_{k=1}^{n} R_k = n \cdot R_O$$

applies and $$R_n^2 + \{-n \cdot R_O - (U_R/I_B)\} \cdot R_n + (U_R - U_{n-1}) \cdot n \cdot R_O/I_B = 0.$$

From this, $R_n$ can be determined directly.

(b) For v=(n−1):

$$\sum_{k=1}^{n-1} R_k = \sum_{k=1}^{n} R_k - R_n = n \cdot R_O - R_n$$

applies and $$R_{n-1}^2 + \{2R_n - (n \cdot R_O - R_n) - (U_R/I_B)\} \cdot R_{n-1} + (-(U_R - U_{n-2}/I_B) - 2R_n) \cdot (nR_O - R_n) - U_{n-2} \cdot R_n/I_B = 0.$$

From this, the value $R_{n-1}$ can be determined directly.

(c) $R_{n-2}$ is calculated from this successively, and then $R_{n-3}$ etc., i.e., $R_v$ up to the value v=2 is calculated in the manner shown in (a) and (b).

The value for $R_1$ is then determined by the relationship $$R_1 \sum_{k=1}^{2} R_k - R_2.$$

Thus, the equation system forming the foundation of the construction of the invention can be resolved without difficulty in order to successively determine the resistances required for the voltage divider ST.

We claim:

1. Analog-to-digital converter, comprising a voltage divider (ST) having n series-connected resistors ($R_v$; v=1, 2, ... n), divider points between said resistors ($R_v$) and an end receiving a d-c reference voltage ($U_R$) versus a base point potential, n identical comparators ($K_v$) each having a first input receiving an analog signal to be processed, a second reference input each being connected to a respective one of said divider points, and an output, a common control logic circuit (LS) connected to said outputs of said comparators ($K_v$) for furnishing a digital signal corresponding to the analog signal to be processed, each of said resistors ($R_v$) being connected between one of said divider points which divider point is applied to that one of said comparators ($K_v$), which is associated with a given ($v^{th}$) output code, and another of said divider points assigned to the next lower output code, and each of said resistors ($R_v$) having a resistance value satisfying the condition:

$$R_v^2 + \left[ \sum_{k=1}^{n-v} \{(k+1) \cdot R_{v+k}\} - \sum_{k=1}^{v} R_k - (U_R/I_B) \right] \cdot R_v +$$

$$\left[ ((U_R - U_{v-1})/I_B) - \sum_{k=1}^{n-v} (k+1)R_{v+k} \right] \cdot \sum_{k=1}^{v} R_k -$$

$$(U_{v-1}/I_B) \cdot \sum_{k=1}^{n-v} R_{v+k} = 0,$$

where $I_B$ is the maximum current flowing through said second reference inputs of said comparators, and $U_v$ is the desired value of said reference voltage at said comparators.

* * * * *